(12) United States Patent
Liu et al.

(10) Patent No.: US 12,015,034 B2
(45) Date of Patent: Jun. 18, 2024

(54) DISPLAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Hanqing Liu, Beijing (CN); Wei Chen, Beijing (CN); Pengcheng Tian, Beijing (CN); Haowei Zou, Beijing (CN); Junru Ma, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 412 days.

(21) Appl. No.: 17/310,392

(22) PCT Filed: Oct. 30, 2020

(86) PCT No.: PCT/CN2020/125410
§ 371 (c)(1),
(2) Date: Jul. 30, 2021

(87) PCT Pub. No.: WO2022/088076
PCT Pub. Date: May 5, 2022

(65) Prior Publication Data
US 2022/0375968 A1  Nov. 24, 2022

(51) Int. Cl.
*H01L 27/12* (2006.01)
(52) U.S. Cl.
CPC ............................... *H01L 27/1255* (2013.01)
(58) Field of Classification Search
CPC .................................................. H01L 27/1255
See application file for complete search history.

(56) References Cited

U.S. PATENT DOCUMENTS

2015/0162347 A1*  6/2015  Yu ...................... H01L 27/1255
257/71

\* cited by examiner

*Primary Examiner* — Peter M Albrecht
(74) *Attorney, Agent, or Firm* — Kinney & Lange, P.A.

(57) ABSTRACT

Disclosed are a display substrate and a display device. The display substrate includes: a base substrate; a plurality of gate lines and a plurality of data lines on the base substrate that intersect to surround a plurality of pixels; at least one thin film transistor on the base substrate and located in each pixel, each thin film transistor including a gate electrode, a first electrode and a second electrode; a storage capacitor on the base substrate and located in each pixel, the storage capacitor including a first capacitor electrode and a second capacitor electrode that are disposed oppositely and located in the same layer, wherein the first capacitor electrode comprises at least an electrode body; and a tip structure, the tip structure and the first capacitor electrode being located in the same layer, and the tip structure including a first tip sub-structure and a second tip sub-structure.

19 Claims, 5 Drawing Sheets

DISPLAY SUBSTRATE AND DISPLAY DEVICE

CROSS REFERENCE

The application is a Section 371 National Stage Application of International Application No. PCT/CN2020/125410 filed on Oct. 30, 2020, entitled "DISPLAY SUBSTRATE AND DISPLAY DEVICE", the content of which is incorporated herein by reference in entirety.

TECHNICAL FIELD

The present disclosure relates to a field of display technology, and in particular to a display substrate and a display device.

BACKGROUND

An electronic paper display device is a new display device that has advantages of both display and paper. A display effect of the electronic paper display device is close to paper, and the electronic paper display device has flexible display, portable, rewritable and low power consumption, and other advantages.

At present, electronic paper display products in industry will be shipped with a protective film being coated after a manufacturing process of an array substrate is completed. However, in actual production, extremely high static electricity will be generated during a removal of the protective film, and static electricity may damage pixels and cause white spot defects.

The above information disclosed in this section is only used to understand the background of the inventive concept of the present disclosure, and therefore, the above information may include information that does not constitute the prior art.

SUMMARY

To solve at least one aspect of the above-mentioned problem, embodiments of the present disclosure present a display substrate and a display device.

In one aspect, a display substrate is provided, including:
a base substrate;
a plurality of gate lines and a plurality of data lines on the base substrate, wherein each gate line extends in a row direction, each data line extends in a column direction, and the plurality of gate lines and the plurality of data lines intersect to surround a plurality of pixels;
at least one thin film transistor on the base substrate and located in each pixel, wherein each thin film transistor includes a gate electrode, a first electrode and a second electrode, the first electrode is one of a source electrode and a drain electrode, and the second electrode is the other one of the source electrode and the drain electrode;
a storage capacitor on the base substrate and located in each pixel, wherein the storage capacitor includes a first capacitor electrode and a second capacitor electrode, the first capacitor electrode and the second capacitor electrode are disposed oppositely, the first capacitor electrode and the second electrode are located in the same layer, and the first capacitor electrode comprises at least an electrode body; and
a tip structure, wherein the tip structure and the first capacitor electrode are located in the same layer, and the tip structure comprises a first tip sub-structure and a second tip sub-structure,
wherein among the gate lines and the data lines that surround any one of the pixels, the data line electrically connected to the thin film transistor in the any one of the pixels is a first data line;
in the any one of the pixels, the first tip sub-structure is connected to a side surface of the electrode body facing the first data line, the second tip sub-structure is connected to a side surface of the first data line facing the electrode body, an end portion of the first tip sub-structure facing the first data line is formed as a first tip, an end portion of the second tip sub-structure facing the electrode body is formed as a second tip, and the first tip and the second tip are disposed oppositely and at an interval in the row direction.

According to some exemplary embodiments, the first capacitor electrode further includes a first protrusion, and the first protrusion is located between the electrode body and the first tip sub-structure; and the first protrusion protrudes toward the first data line of the pixel relative to the electrode body, and the first tip sub-structure is connected to an end portion of the first protrusion facing the first data line.

According to some exemplary embodiments, an orthographic projection of the electrode body of the first capacitor electrode on the base substrate falls within an orthographic projection of the second capacitor electrode on the base substrate.

According to some exemplary embodiments, the first tip sub-structure includes a first side surface close to the thin film transistor and a second side surface away from the thin film transistor, and the first side surface of the first tip sub-structure and the second side surface of the first tip sub-structure converge toward the first data line and intersect at the first tip; and/or, the second tip sub-structure includes a first side surface close to the thin film transistor and a second side surface away from the thin film transistor, and the first side surface of the second tip sub-structure and the second side surface of the second tip sub-structure converge toward the electrode body and intersect at the second tip.

According to some exemplary embodiments, a distance between the first tip and the second tip in the row direction is between 1 to 10 microns.

According to some exemplary embodiments, the first tip sub-structure includes a first tip body portion, the first tip body portion is located between the first tip and the first protrusion, the first tip body portion includes a first side surface close to the thin film transistor and a second side surface away from the thin film transistor, and the first side surface of the first tip body portion is parallel to the second side surface of the first tip body portion; and/or, the second tip sub-structure includes a second tip body portion, the second tip body portion is located between the second tip and the first data line, the second tip body portion includes a first side surface close to the thin film transistor and a second side surface away from the thin film transistor, and the first side surface of the second tip body portion is parallel to the second side surface of the second tip body portion.

According to some exemplary embodiments, a distance between the first side surface of the first tip body portion and the second side surface of the first tip body portion in the column direction is between 3 to 10 microns; and/or, a distance between the first side surface of the second tip body portion and the second side surface of the second tip body portion in the column direction is between 3 to 10 microns.

According to some exemplary embodiments, among the gate lines and the data lines that surround the any one of the pixels, the gate line electrically connected to the thin film transistor in the any one of the pixels is a first gate line, the other data line disposed at an interval from the first data line is a second data line, and the other gate line disposed at an interval from the first gate line is a second gate line; and the second capacitor electrode includes a first side surface facing the first gate line, the electrode body includes a first side surface facing the first gate line, and the first side surface of the second capacitor electrode is closer to the first gate line than the first side surface of the electrode body; and/or, the second capacitor electrode includes a second side surface facing the second gate line, the electrode body includes a second side surface facing the second gate line, and the second side surface of the second capacitor electrode is closer to the second gate line than the second side surface of the electrode body; and/or, the second capacitor electrode includes a third side surface facing the second data line, the electrode body includes a third side surface facing the second data line, and the third side surface of the second capacitor electrode is closer to the second data line than the third side surface of the electrode body; and/or, the second capacitor electrode includes a fourth side surface facing the first data line, the electrode body includes a fourth side surface facing the first data line, and the fourth side surface of the second capacitor electrode is closer to the first data line than the fourth side surface of the electrode body.

According to some exemplary embodiments, a distance between an orthographic projection of the first side surface of the second capacitor electrode on the base substrate and an orthographic projection of the first side surface of the electrode body on the base substrate in the column direction is greater than 3 microns; and/or, a distance between an orthographic projection of the second side surface of the second capacitor electrode on the base substrate and an orthographic projection of the second side surface of the electrode body on the base substrate in the column direction is greater than 3 microns; and/or, a distance between an orthographic projection of the third side surface of the second capacitor electrode on the base substrate and an orthographic projection of the third side surface of the electrode body on the base substrate in the row direction is greater than 3 microns; and/or, a distance between an orthographic projection of the fourth side surface of the second capacitor electrode on the base substrate and an orthographic projection of the fourth side surface of the electrode body on the base substrate in the row direction is greater than 3 microns.

According to some exemplary embodiments, the display substrate further includes a pixel electrode on the base substrate and located in each pixel, wherein the pixel electrode is electrically connected to the first capacitor electrode through at least one via hole, and an orthographic projection of the at least one via hole on the base substrate falls within an orthographic projection of the first protrusion on the base substrate.

According to some exemplary embodiments, the display substrate includes a plurality of tip structures, and the plurality of tip structures are disposed at an interval in the column direction; and in each tip structure, the first tip of the first tip substructure and the second tip of the second tip substructure are disposed oppositely and at an interval in the row direction.

According to some exemplary embodiments, the display substrate further includes a passivation layer, and the passivation layer is located between a layer where the pixel electrode is located and a layer where the first capacitor electrode is located; and at least a part of the passivation layer is located in a gap between the first tip and the second tip.

According to some exemplary embodiments, the display substrate further includes a gate insulating layer, the gate insulating layer is located between a layer where the second capacitor electrode is located and the layer where the first capacitor electrode is located; and a dielectric constant of the gate insulating layer is greater than a dielectric constant of the passivation layer.

According to some exemplary embodiments, the at least one thin film transistor includes a first thin film transistor and a second thin film transistor; the first capacitor electrode includes a second protrusion, the second protrusion and the first protrusion are located on the same side of the electrode body, the second protrusion is electrically connected to a first electrode of the first thin film transistor, a second electrode of the first thin film transistor is electrically connected to a first electrode of the second thin film transistor, and a second electrode of the second thin film transistor is electrically connected to the first data line; and the display substrate further includes a common electrode line, the common electrode line extends in the row direction, and the common electrode line is electrically connected to the second capacitor electrode.

According to some exemplary embodiments, the second capacitor electrode and the gate electrode are located in the same layer.

In another aspect, a display device is provided, wherein the display device includes the display substrate as described above.

BRIEF DESCRIPTION OF THE DRAWINGS

Through the following description of the present disclosure with reference to the drawings, other purposes and advantages of the present disclosure will be apparent, and may help a comprehensive understanding of the present disclosure.

It should be noted that, for clarity, in the drawings used to describe the embodiments of the present disclosure, sizes of layers, structures, or regions may be enlarged or reduced, that is, the drawings are not drawn according to actual scale.

DETAILED DESCRIPTION OF EMBODIMENTS

In the following description, for purpose of explanation, many specific details are set forth to provide a comprehensive understanding of various exemplary embodiments. However, it is obvious that various exemplary embodiments may be implemented without the specific details or one or more equivalent arrangements. In other cases, well-known structures and devices are shown in block diagram form to avoid unnecessarily obscuring the various exemplary embodiments. In addition, the various exemplary embodiments may be different, but are not necessarily exclusive. For example, without departing from the inventive concept, specific shapes, configurations and characteristics of an exemplary embodiment may be used or implemented in another exemplary embodiment.

In the drawings, sizes and relative sizes of elements may be enlarged for clarity and/or description purposes. In this way, a size and a relative size of each element are not necessarily to be limited to a size and a relative size shown in the drawing. When the exemplary embodiment may be implemented differently, a specific process sequence may be performed differently from a sequence described. For example, two consecutively described processes may be performed substantially simultaneously or in an order opposite to the described order. In addition, the same reference numerals indicate the same elements.

When an element is described as being "on", "connected to" or "coupled to" another element, the element may be directly on the another element, directly connected to the another element or directly coupled to the another element, or an intermediate element may be present. However, when an element is described as being "directly on", "directly connected to" or "directly coupled to" another element, there is no intermediate element. Other terms and/or expressions used to describe the relationship between elements should be interpreted in a similar manner, for example, "between" and "directly between", "adjacent" and "directly adjacent", "above" and "directly above" etc. In addition, the term "connect" may refer to a physical connection, an electrical connection, a communication connection, and/or a fluid connection. In addition, X axis, Y axis, and Z axis are not limited to the three axes of the Cartesian coordinate system, which may be interpreted in broader meaning. For example, the X axis, the Y axis, and the Z axis may be perpendicular to each other, or may represent different directions that are not perpendicular to each other. For the purpose of the present disclosure, "at least one of X, Y, and Z" and "at least one selected from a group consisting of X, Y, and Z" may be interpreted as only X, only Y, only Z, or any combination of two or more of X, Y, and Z such as XYZ, XY, YZ, and ZZ. As shown in the present disclosure, the term "and/or" includes any and all combinations of one or more of the related items.

It should be understood that, although the terms first, second, etc. may be used herein to describe various elements, the elements should not be limited by the terms. The terms are only used to distinguish one element from another. For example, without departing from the scope of the exemplary embodiments, a first element may be named as a second element, and similarly, a second element may be named as a first element.

In the present disclosure, unless otherwise specified, the expression "patterning process" generally includes steps of photoresist coating, exposure, development, etching and photoresist stripping, and the like. The expression "one patterning process" refers to a process of forming patterned layers, elements, components and the like by using one mask.

It should be noted that the expression "same layer" refers to a layer structure formed by using the same film forming process to form a film layer for forming specific patterns and then using the same mask to pattern the film layer through a patterning process. Depending on difference of the specific patterns, the patterning process may include a plurality of exposure, development or etching processes, and the specific patterns in the formed layer structure may be continuous or discontinuous. The specific patterns may also be at different heights or have different thicknesses.

It should be noted that, in order to clearly illustrate a stacking relationship between various elements, components, members or patterns, in the drawings of the present disclosure, unless otherwise specified, elements, components, members or patterns located in the same layer are generally shown using the same cross-sectional line.

It should be noted that since a source electrode and a drain electrode of a thin film transistor may generally be used interchangeably, in the present disclosure, the expressions such as first electrode and second electrode of thin film transistor are used. It should be understood that the "first electrode" of the thin film transistor may refer to one of the source electrode and the drain electrode of the thin film transistor, and the "second electrode" of the thin film transistor may refer to the other one of the source electrode and the drain electrode of the thin film transistor.

In the present disclosure, unless otherwise specified, the expressions "disposed continuously" and "extending continuously" refer to that two regions, parts or components extend, connect or dispose continuously and without interruption, that is, two regions, parts or components form an integral structure, and there is no disconnection between the two regions, parts or components.

The present disclosure provides a display substrate, the display substrate includes: a base substrate; a plurality of gate lines and a plurality of data lines on the base substrate, wherein each gate line extends in a row direction, each data line extends in a column direction, and the plurality of gate lines and the plurality of data lines intersect to surround a plurality of pixels; at least one thin film transistor on the base substrate and located in each pixel, wherein each thin film transistor includes a gate electrode, a first electrode and a second electrode, the first electrode is one of a source electrode and a drain electrode, and the second electrode is the other one of the source electrode and the drain electrode; a storage capacitor on the base substrate and located in each pixel, wherein the storage capacitor includes a first capacitor electrode and a second capacitor electrode, the first capacitor electrode and the second capacitor electrode are disposed oppositely, the first capacitor electrode and the second electrode are located in the same layer, the second capacitor electrode and the gate electrode are located in the same layer, and the first capacitor electrode includes at least an electrode body; and a tip structure, wherein the tip structure and the first capacitor electrode are located in the same layer, and the tip structure includes a first tip sub-structure and a second tip sub-structure, wherein, among the gate lines and the data lines that surround any one of the pixels, the data line electrically connected to the thin film transistor in the any one of the pixels is a first data line; in the any one of the pixels, the first tip sub-structure is connected to a side surface of the electrode body facing the first data line, the second tip sub-structure is connected to a side surface of the first data line facing the electrode body, an end portion of the first tip sub-structure facing the first data line is formed as a first tip, an end of the second tip substructure facing the electrode body is formed as a second tip, and the first tip and the second tip are disposed oppositely and at an interval in the row direction. In the embodiments of the present disclosure, by designing a tip structure in a layer where an upper electrode of the storage capacitor is located, static electricity may be induced to release from the tip structure, which prevents static electricity from breaking down a gate insulating layer and damaging a lower electrode of the storage capacitor, thereby preventing normal display of the pixel from being affected.

Figure 1:
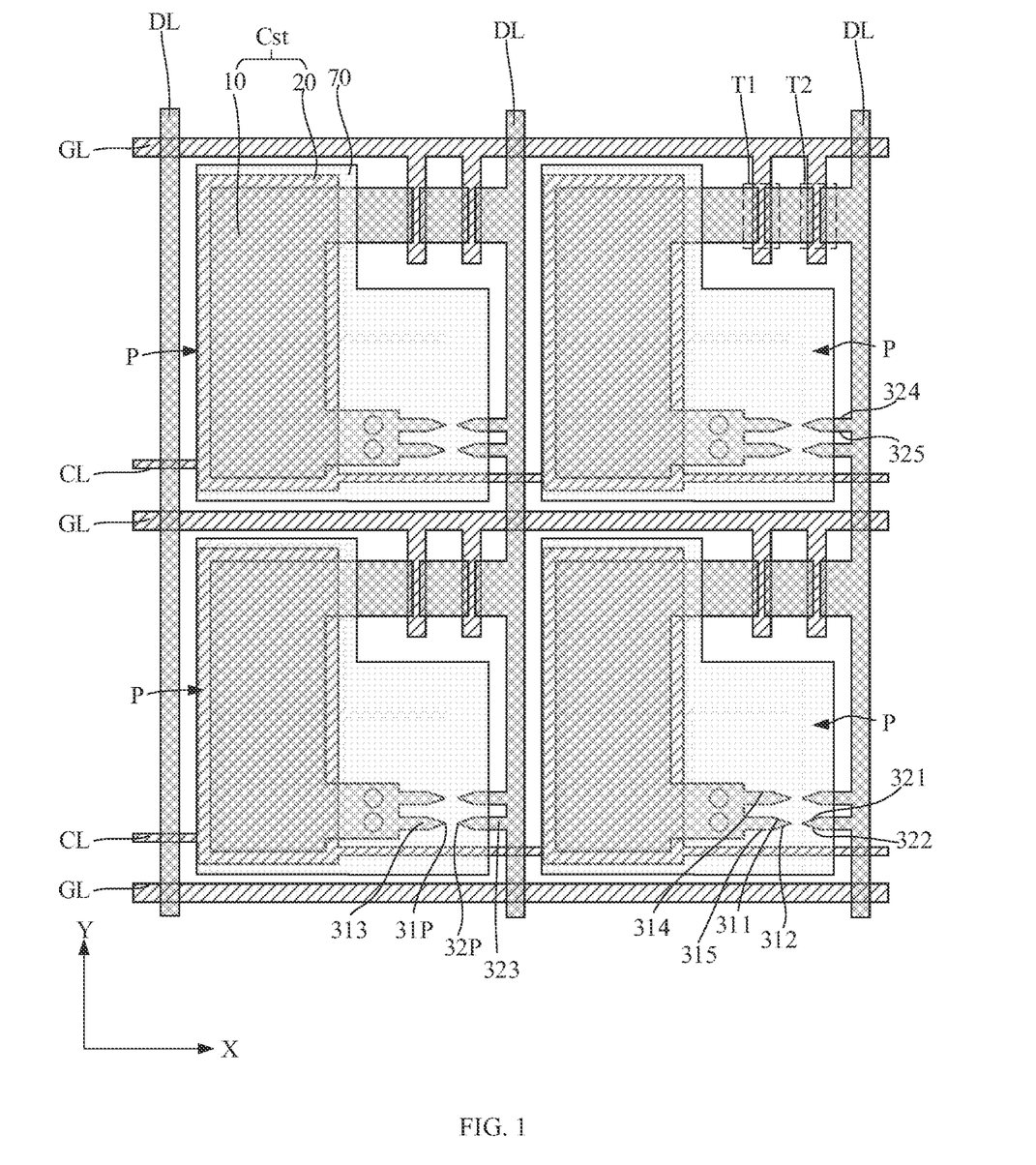
FIG. 1 is a schematic plan view of a display substrate according to some exemplary embodiments of the present disclosure, in which several (for example, 4) pixels included in the display substrate are schematically shown.
Figure 2:
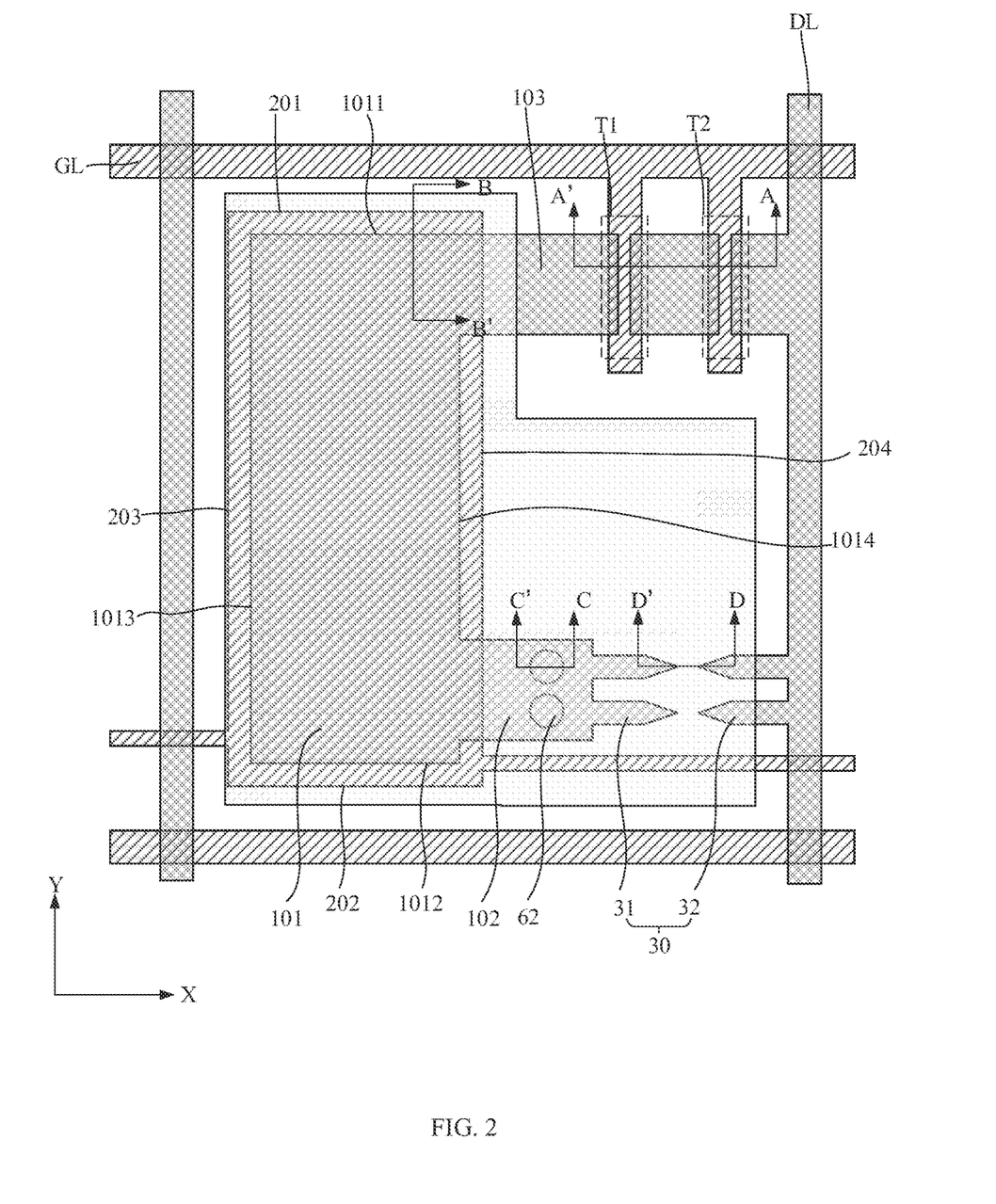
FIG. 2 is a schematic plan view of one pixel included in the display substrate in FIG. 1.
Figure 3:
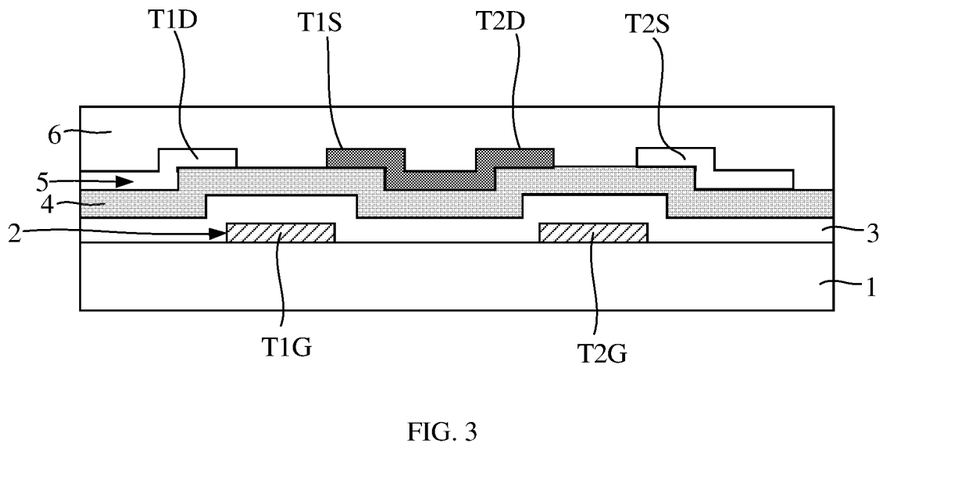
FIG. 3 is a cross-sectional view of the display substrate taken along line AA' in FIG. 2 according to some exemplary embodiments of the present disclosure.
Figure 4:
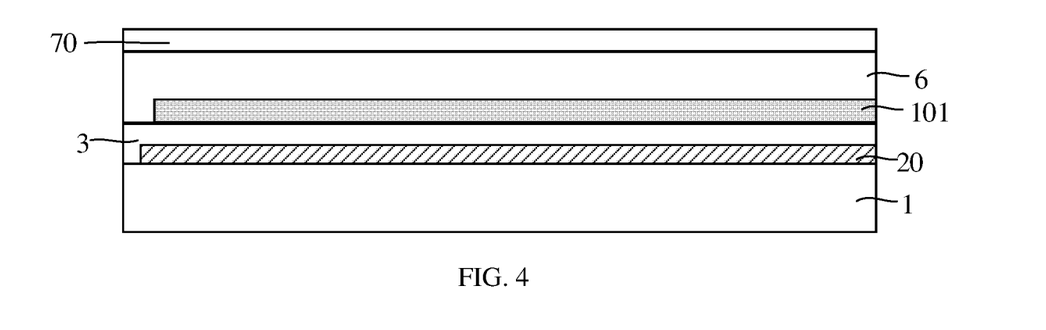
FIG. 4 is a cross-sectional view of the display substrate taken along line BB' in FIG. 2 according to some exemplary embodiments of the present disclosure.
Figure 5:
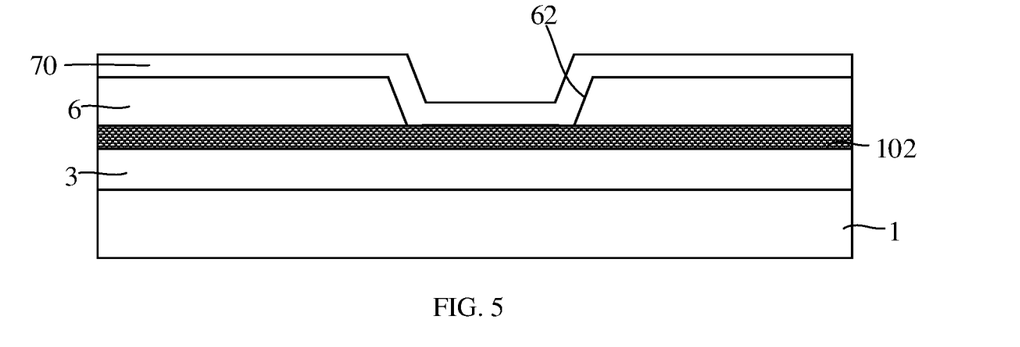
FIG. 5 is a cross-sectional view of the display substrate taken along line CC' in FIG. 2 according to some exemplary embodiments of the present disclosure.
Figure 6:
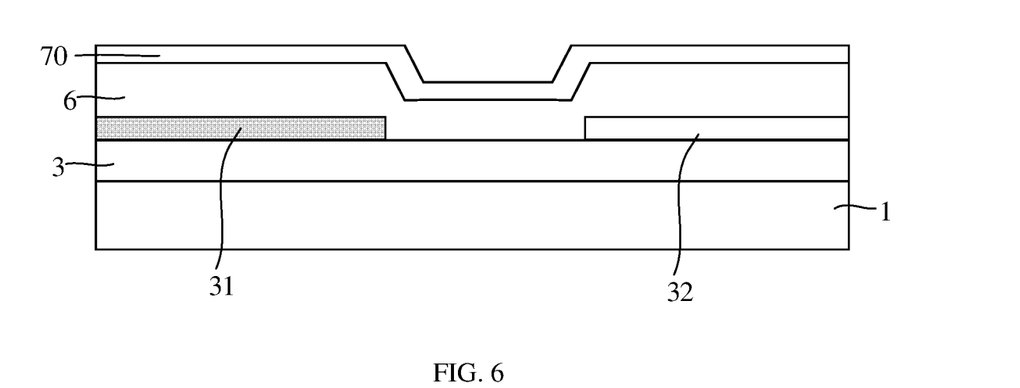
FIG. 6 is a cross-sectional view of the display substrate taken along line DD' in FIG. 2 according to some exemplary embodiments of the present disclosure.
Figure 7:
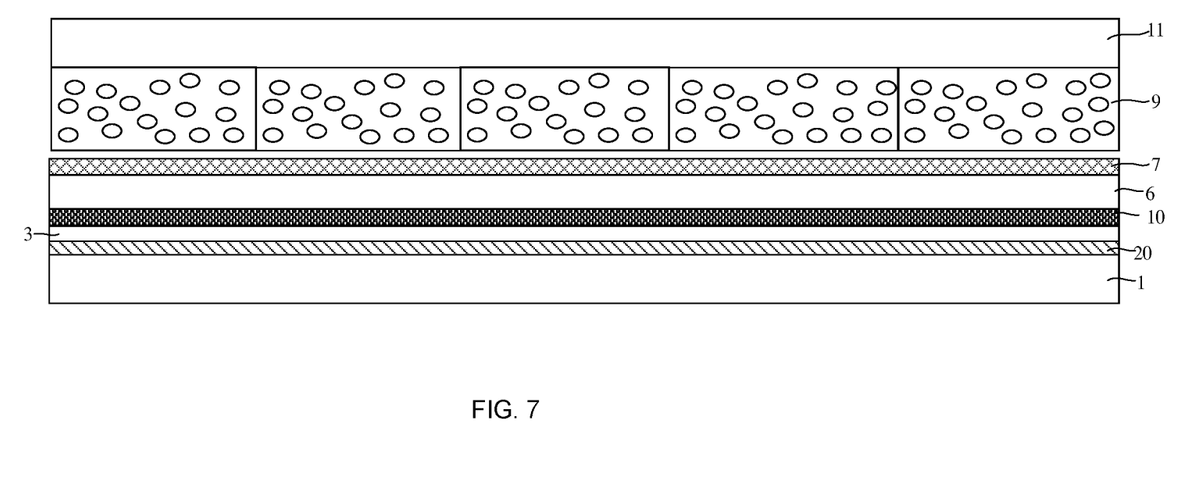
FIG. 7 is a cross-sectional view of a display device according to some exemplary embodiments of the present disclosure.

FIG. 1 is a schematic plan view of a display substrate according to some exemplary embodiments of the present disclosure, in which a plurality of (for example, 4) pixels included in the display substrate are schematically shown. FIG. 2 is a schematic plan view of one pixel included in the display substrate in FIG. 1. FIG. 3 is a cross-sectional view of the display substrate taken along line AA' in FIG. 2 according to some exemplary embodiments of the present disclosure. FIG. 4 is a cross-sectional view of the display substrate taken along line BB' in FIG. 2 according to some exemplary embodiments of the present disclosure. FIG. 5 is a cross-sectional view of the display substrate taken along line CC' in FIG. 2 according to some exemplary embodiments of the present disclosure. FIG. 6 is a cross-sectional view of the display substrate taken along line DD' in FIG. 2 according to some exemplary embodiments of the present disclosure. FIG. 7 is a cross-sectional view of a display device according to some exemplary embodiments of the present disclosure.

For example, the display substrate may be a display substrate of an electronic paper display device, and it may be an array substrate of an electronic paper display device.

Referring to FIGS. 1 to 6 in combination, the display substrate may include a plurality of pixels P. In FIG. 1, a plurality of (for example, 4) pixels P are exemplarily shown. It should be understood that the display substrate may include more pixels P. Specifically, the display substrate includes: a base substrate 1; a plurality of gate lines (or called scan lines) GL, a plurality of data lines (or called source lines) DL and a plurality of common electrode lines CL disposed on the base substrate 1. The plurality of gate lines GL extend in parallel in a row direction X, the plurality of data lines DL extend in parallel in a column direction Y, the plurality of common electrode lines CL extend in parallel in the row direction X, and each common electrode line CL is located between two adjacent gate lines GL of the plurality of gate lines GL. The plurality of gate lines GL and the plurality of data lines DL intersect to surround a plurality of pixels P.

The display substrate may include at least one thin film transistor located in one pixel P. For example, in some exemplary embodiments, the at least one thin film transistor may include 2 thin film transistors. For ease of description, the two thin film transistors are referred to as a first thin film transistor T1 and a second thin film transistor T2, respectively, and the first thin film transistor T1 is farther away from the data line DL than the second thin film transistor T2. That is, in FIGS. 1 and 2, in one pixel, the first thin film transistor T1 is located on a left side of the second thin film transistor T2.

The first thin film transistor T1 includes a first source electrode T1S, a first gate electrode T1G and a first drain electrode T1D, and the second thin film transistor T2 includes a second source electrode T2S, a second gate electrode T2G and a second drain electrode T2D. The first drain electrode T1D of the first thin film transistor T1 is electrically connected to a pixel electrode. The first source electrode T1S of the first thin film transistor T1 and the second drain electrode T2D of the second thin film transistor T2 are an integral structure. A gate line GL is electrically connected to the first gate electrode T1G of the first thin film transistor T1 and the second gate electrode T2G of the second thin film transistor T2. For example, the gate line GL, the first gate electrode T1G and the second gate electrode T2G are an integral structure, that is, the gate line GL, the first gate electrode T1G and the second gate electrode T2G are a continuously extending integral structure. The second source electrode T2S of the second thin film transistor T2 is electrically connected to the data line DL.

It should be understood that a source electrode and a drain electrode of a thin film transistor may be interchanged. For example, the first source electrode of the first thin film transistor may be electrically connected to the pixel electrode, and the second drain electrode of the second thin film transistor may be electrically connected to the data line.

An electronic ink is controlled by two thin film transistors connected in series to achieve display, and the two thin film transistors connected in series may reduce leakage current and improve display quality.

Continuing to refer to FIGS. 1 to 6, the display substrate may include a plurality of film layers disposed on the base substrate 1. For example, the plurality of film layers include at least a first conductive layer 2, a gate insulating layer 3, an active layer 4, a second conductive layer 5, a passivation layer 6 and a pixel conductive layer 7.

The display substrate may include a storage capacitor Cst disposed on the base substrate 1 and located in each pixel P, the storage capacitor Cst may include a first capacitor electrode 10 and a second capacitor electrode 20, and the first capacitor electrode 10 and the second capacitor electrode 20 are disposed oppositely.

The first gate electrode T1G of the first thin film transistor T1, the second gate electrode T2G of the second thin film transistor T2, the gate line GL, the common electrode line CL and the second capacitor electrode 20 may be located in the first conductive layer 2.

The gate insulating layer 3 is located on a side of the first conductive layer 2 away from the base substrate 1.

The active layer 4 is located on a side of the gate insulating layer 3 away from the base substrate 1. The active layer 4 may include a semiconductor material such as amorphous silicon, polysilicon or metal oxide, etc.

The second conductive layer 5 is located on a side of the active layer 4 away from the base substrate 1. The first source electrode T1S and the first drain electrode T1D of the first thin film transistor T1, the second source electrode T2S and the second drain electrode T2D of the second thin film transistor T2, the data line DL and the first capacitor electrode 10 may be located in the second conductive layer 5.

The passivation layer 6 is located on a side of the second conductive layer 5 away from the base substrate 1. An orthographic projection of the passivation layer 6 on the base substrate 1 covers an orthographic projection of the second conductive layer 5 on the base substrate 1. The passivation layer 6 is made of an insulating material.

The pixel conductive layer 7 is located on a side of the passivation layer 6 away from the base substrate 1. The display substrate may further include a pixel electrode 70, and the pixel electrode 70 is located in the pixel conductive layer 7. For example, the pixel conductive layer 7 may be made of a transparent conductive material such as ITO.

In the present disclosure, for ease of description, referring to FIG. 2 in combination, among the data lines and the gate lines that surround any one of the pixels P, for example, two data lines and two gate lines surround a pixel P. That is, among the two data lines and the two gate lines that surround any one of the pixels P, the gate line electrically connected to the thin film transistor in the any one of the pixels P is a first gate line, a data line electrically connected to the thin film transistor in the pixel P is a first data line, the other data line disposed at an interval from the first data line is a second data line, and the other gate line disposed at an interval from the first gate line is a second gate line. In the embodiment shown in FIG. 2, a gate line on an upper side is the first gate line, a gate line on a lower side is the second gate line, a data line on a right side is the first data line, and a data line on a left side is the second data line.

Referring to FIGS. 1 to 7 in combination, the first capacitor electrode 10 may include an electrode body 101, a first protrusion 102 and a second protrusion 103. In any one of the pixels, the electrode body 101 is located between adjacent first gate line and second gate line, and the electrode body 101 is located between adjacent first data line and second data line. The first protrusion 102 and the second protrusion 103 both protrude toward the first data line DL of the pixel relative to the electrode body 101, that is, the first protrusion 102 and the second protrusion 103 are located on the same side of the electrode body 101. For example, an orthographic projection of the electrode body 101 on the base substrate 1 may have a rectangular or substantially rectangular shape, and the first protrusion 102 and the second protrusion 103 are parts that extend from the rectangular electrode body 101 toward the first data line DL. The electrode body 101, the first protrusion 102 and the second protrusion 103 are an integral structure, that is, the electrode body 101, the first protrusion 102 and the second protrusion 103 are a continuously extending integral structure.

The first drain electrode T1D of the first thin film transistor T1 may be electrically connected to the second protrusion 103. For example, the first drain electrode T1D of the first thin film transistor T1 and the second protrusion 103 are an integral structure, that is, the first drain electrode T1D of the first thin film transistor T1 and the second protrusion 103 are a continuously extending integral structure. The second source electrode T2S of the second thin film transistor T2 is electrically connected to the data line DL. For example, the second source electrode T2S of the second thin film transistor T2 and the first data line DL are an integral structure, that is, the second source electrode T2S of the second thin film transistor T2 and the first data line DL are a continuously extending integral structure.

The display substrate may further include at least one via hole 62 penetrating the passivation layer 6, and each via hole 62 exposes a part of the first capacitor electrode 10. A part of the pixel conductive layer 7 may be filled in the via hole 62. In this way, the pixel electrode 70 may be electrically connected to the first capacitor electrode 10 through the at least one via hole 62. The first capacitor electrode 10 is electrically connected to the first drain electrode T1D of the first thin film transistor T1. In this way, the pixel electrode 70 is electrically connected to the first drain electrode T1D of the first thin film transistor T1. In this way, under the control of gate signals applied by the gate line GL, signals (for example, voltage) applied by the data line DL may be transmitted to the pixel electrode.

In the embodiments of the present disclosure, the first capacitor electrode 10 is applied with data signals (i.e, Vdata).

Referring to FIGS. 1 and 2, the second capacitor electrode 20 is electrically connected to the common electrode lines CL, that is, the second capacitor electrode 20 is applied with common voltages (i.e, Vcom). The first capacitor electrode 10 and the second capacitor electrode 20 are disposed oppositely and at an interval in a thickness direction of the base substrate 1, and a part of the gate insulating layer 3 serving as an insulating layer is disposed between the first capacitor electrode 10 and the second capacitor electrode 20. In this way, the storage capacitor Cst is formed.

In the embodiments of the present disclosure, while the first capacitor electrode 10 serves as a capacitor plate of the storage capacitor Cst, the first capacitor electrode also serves as a conductive connecting portion between the thin film transistor and the pixel electrode. While the second capacitor electrode 20 serves as the other capacitor plate of the storage capacitor Cst, the second capacitor electrode also serves as a common electrode.

Referring to FIG. 7, an electronic ink layer 9 is disposed on a side of the pixel conductive layer 7 away from the base substrate 1. For example, the electronic ink layer 9 may be disposed on a counter substrate 11. It should be understood that an upper electrode is also disposed on the counter substrate 11. The electronic ink layer 9 may include a plurality of microcapsules, and the microcapsules include charged particles. By controlling an electric field between the pixel electrode and the upper electrode, the charged particles may be driven to move in the microcapsules. In this way, by adjusting colors of the charged particles in the microcapsules, the electronic ink may display patterns and colors.

Continuing to refer to FIGS. 1 to 6, the display substrate may further include a tip structure 30, the tip structure 30 and the first capacitor electrode 10 are located in the same layer, that is, the tip structure 30 is located in the second conductive layer 5.

For example, the tip structure 30 may include a first tip sub-structure 31 and a second tip sub-structure 32.

In some embodiments of the present disclosure, the display substrate may include a plurality of tip structures 30, the plurality of tip structures 30 are disposed at an interval in the column direction Y. For example, one first tip sub-structure 31 and one second tip sub-structure 32 disposed oppositely may be referred to as a group of tip structures. The display substrate may include a plurality of groups of tip structures disposed at an interval in the column direction Y. For example, 1 to 10 groups of tip structures may be disposed.

In each tip structure, a first tip of the first tip sub-structure and a second tip of the second tip sub-structure are disposed oppositely and at an interval in the row direction.

In any one of the pixels P, the first tip sub-structure 31 is connected to an end portion of the first protrusion 102 facing the first data line DL, the second tip sub-structure 32 is connected to a side surface of the first data line DL facing the first protrusion 102, an end portion of the first tip sub-structure 31 facing the first data line DL is formed as a first tip 31P, an end portion of the second tip sub-structure 32 facing the first protrusion 102 is formed as a second tip 32P, and the first tip 31P and the second tip 32P are disposed oppositely and at an interval in the row direction X.

For example, the first tip sub-structure 31, the first protrusion 102 and the electrode body 101 are an integral structure, that is, the first tip substructure, the first protrusion and the electrode body are a continuously extending integral structure. The second tip sub-structure 32 and the first data line DL are an integral structure, that is, the second tip substructure and the first data line are a continuously extending integral structure.

When electrostatic charges are released to an object, induced charges will be generated on a surface of an adjacent conductor, and the induced charges are evenly distributed on the surface of the conductor. However, when there is curvature on a surface of the conductor (such as unevenness, bending, sharp corners, etc.), the charges will accumulate at a location with a large radius of curvature, a charge density will be higher, and an electric field formed by the charges and other objects will be larger, which is prone to discharge phenomenon. The phenomenon is tip discharging, such as a discharge effect of a lightning rod. Moreover, as described above, electronic paper display products in industry will be shipped with a protective film being coated after a manufacturing process of an array substrate is completed, and extremely high static electricity will be generated during a removal of the protective film. For example, the static electricity at this time may be above one hundred volts, and static electricity will enter the first conductive layer from the pixel conductive layer on the surface, and static electricity discharging generally occurs on the storage capacitor. For example, the static electricity discharging generally occurs at an edge of a lower electrode (that is, an electrode in the first conductive layer) in the first conductive layer of the storage capacitor. Due to a slope angle at the edge of the lower electrode and a curvature changes greatly, charges is more densely distributed at the edge of the lower electrode. And when the gate insulating layer is formed at the edge of the lower electrode, the gate insulating layer at the edge of the lower electrode is less dense than other regions due to the slope angle. Therefore, static electricity breakdown is more likely to occur, so that the second conductive layer and the first conductive layer are connected at the edge of the lower electrode, thereby causing display defects.

In the embodiments of the present disclosure, by designing the tip structure in the layer where the upper electrode of the storage capacitor is located, static electricity may be induced to release from the tip structure, which prevents static electricity from breaking down the gate insulating layer and damaging the lower electrode of the storage capacitor, thereby preventing normal display of the pixel from being affected. Moreover, when static electricity is released from the tip structure, the static electricity may be released to the data line through the first tip sub-structure and the second tip sub-structure. Since the data line extend in the column direction for a long distance and a resistance of the data line is relatively large, the static electricity may be evenly channeled to other locations through the data line to reduce the damage caused by the static electricity. In the display substrate provided by the embodiments of the present disclosure, by designing the tip structure, the static electricity may be effectively released, and the pixels may be prevented from being damaged by the static electricity. In addition, the tip structure of the display substrate provided by the embodiments of the present disclosure may also achieve purpose of preventing static electricity in the manufacturing process of the array substrate.

For example, an orthographic projection of the pixel electrode 70 on the base substrate 1 may cover an orthographic projection of the second capacitor electrode 20 on the base substrate 1. The orthographic projection of the pixel electrode 70 on the base substrate 1 may cover an orthographic projection of the first protrusion 102 on the base substrate 1. The orthographic projection of the pixel electrode 70 on the base substrate 1 may cover an orthographic projection of the first tip sub-structure 31 on the base substrate 1. The orthographic projection of the pixel electrode 70 on the base substrate 1 may at least partially overlap with an orthographic projection of the second tip sub-structure 32 on the base substrate 1.

The orthographic projection of the pixel electrode 70 on the base substrate 1 may be spaced apart from an orthographic projection of the thin film transistor on the base substrate 1, that is, the orthographic projection of the pixel electrode 70 on the base substrate 1 does not overlap with an orthographic projection of the thin film transistor on the base substrate 1. Optionally, the orthographic projection of the pixel electrode 70 on the base substrate 1 may at least partially overlap with the orthographic projection of the thin film transistor on the base substrate 1.

Referring to FIGS. 1 and 2, the first tip sub-structure 31 includes a first side surface 311 (i.e, an upper side surface in the drawings) close to the thin film transistor and a second side surface 312 (i.e, a lower side surface in the drawings) away from the thin film transistor. The first side surface 311 and the second side surface 312 are both inclined with respect to the row direction X. The first side surface 311 of the first tip sub-structure and the second side surface 312 of the first tip sub-structure converge toward the first data line DL and intersect at the first tip 31P. For example, an angle between the first side surface 311 and the second side surface 312 at the first tip 31P may be less than 90°, for example, may be in a range of 15° to 75°.

The second tip sub-structure 32 includes a first side surface 321 (that is, an upper side surface in the drawings) close to the thin film transistor and a second side surface 322 (that is, a lower side surface in the drawings) away from the thin film transistor. The first side surface 321 and the second side surface 322 are both inclined with respect to the row direction X. The first side surface 321 of the second tip sub-structure and the second side surface 322 of the second tip sub-structure converge toward the first protrusion 102 and intersect at the second tip 32P. For example, an angle between the first side surface 321 and the second side surface 322 at the second tip 32P may be less than 90°, for example, may be in the range of 15° to 75°.

The first tip 31P and the second tip 32P are disposed oppositely in the row direction X, and the first tip 31P and the second tip 32P are disposed at a predetermined interval in the row direction X. For example, the predetermined interval may be between 1 and 10 microns. For example, the predetermined interval may be between 2 to 3 microns.

Referring to FIG. 6, at least a part of the passivation layer 6 is located in a gap between the first tip 31P and the second tip 32P. That is, the passivation layer 6 fills the gap between the first tip 31P and the second tip 32P.

In some embodiments, a dielectric constant of the gate insulating layer 3 is greater than a dielectric constant of the passivation layer 6. For example, the dielectric constant of the gate insulating layer 3 is about 7.5, and the dielectric constant of the passivation layer 6 is about in a range of 5.5 to 6.5. An insulating performance of the passivation layer 6 is worse than an insulating performance of the gate insulating layer 3. In this way, a breakdown voltage of the passivation layer 6 is lower than a breakdown voltage of the gate insulating layer 3. In a process of static discharging, static electricity is more likely to break down the passivation layer, that is, static electricity is more likely to be released by breaking down the passivation layer between two tip sub-structures.

Continuing to refer to FIG. 2, the first tip sub-structure 31 may include a first tip body portion 313. The first tip body portion 313 is located between the first tip 31P and the first protrusion 102, the first tip body portion 313 includes a first side surface 314 close to the thin film transistor and a second side surface 315 far away from the thin film transistor, and the first side surface 314 of the first tip body portion is parallel to the second side surface 315 of the first tip body portion. For example, an orthographic projection of the first tip body portion 313 on the base substrate 1 may have a rectangular or substantially rectangular shape. An orthographic projection of a part including the first side surface 311, the second side surface 312 and the first tip 31P on the base substrate 1 may have a triangular shape.

The second tip sub-structure 32 may include a second tip body portion 323. The second tip body portion 323 is located between the second tip 32P and the first data line DL, the second tip body portion 323 includes a first side surface 324 close to the thin film transistor and a second side surface 325 away from the thin film transistor, and the first side surface 324 of the second tip body portion is parallel to the second side surface 325 of the second tip body portion. For example, an orthographic projection of the second tip body portion 323 on the base substrate 1 may have a rectangular or substantially rectangular shape. An orthographic projection of a part including the first side surface 321, the second side surface 322 and the second tip 32P on the base substrate 1 may have a triangular shape.

For example, a width of the first tip body portion 313 may be between 3 to 10 microns, that is, a distance between the first side surface 314 and the second side surface 315 of the first tip body portion 313 in the column direction Y is between 3-10 microns, for example, between 4 to 7 microns. A width of the second tip body portion 323 may be between 3 to 10 microns, that is, a distance between the first side surface 324 and the second side surface 325 of the second tip body portion 323 in the column direction Y is between 3 to 10 microns, for example, between 4 to 7 microns.

Referring to FIGS. 1 to 6, an orthographic projection of the electrode body 101 of the first capacitor electrode on the base substrate 1 falls within an orthographic projection of the second capacitor electrode 20 on the base substrate 1. For example, the orthographic projection of the electrode body 101 of the first capacitor electrode on the base substrate 1 may have a rectangular or substantially rectangular shape, the orthographic projection of the second capacitor electrode 20 on the base substrate 1 may have a rectangular or substantially rectangular shape. An area of the orthographic projection of the electrode body 101 of the first capacitor electrode on the base substrate 1 is smaller than an area of the orthographic projection of the second capacitor electrode 20 on the base substrate 1.

In some embodiments, referring to FIG. 2, on three sides where the first gate line (upper side), the second gate line (lower side) and the second data line (left side) are located, the orthographic projection of the second capacitor electrode 20 on the base substrate 1 all exceed the orthographic projection of the first capacitor electrode 10 on the base substrate 1. On a side where the first data line is located (right side), except for the first protrusion 102 and the second protrusion 103, the orthographic projection of the second capacitor electrode 20 on the base substrate 1 exceeds an orthographic projection of the first capacitor electrode 10 on the base substrate 1. That is, in the embodiments of the present disclosure, the orthographic projection of the electrode body 101 of the first capacitor electrode 10 on the base substrate is rectangular or substantially rectangular, the orthographic projection of the second capacitor electrode 20 on the base substrate is rectangular or substantially rectangular, and the orthographic projection of the second capacitor electrode 20 on the base substrate covers the orthographic projection of the electrode body 101 of the first capacitor electrode 10 on the base substrate.

In the embodiments of the present disclosure, the area of the lower electrode (i.e, the second capacitor electrode 20) on the gate conductive layer is larger than the area of the upper electrode (i.e, the electrode body of the first capacitor electrode) on source/drain conductive layer. In this way, referring to FIG. 4, an edge of the second capacitor electrode 20 of the storage capacitor Cst exceeds an edge of the first capacitor electrode 10 in a direction parallel to a plane where the base substrate 1 is located. Therefore, at an edge of the storage capacitor Cst, that is, at an edge of a part where the second capacitor electrode 20 overlaps with the first capacitor electrode 10, no sharp corner is formed. And at the edge of the storage capacitor Cst, a surface of the second capacitor electrode 20 facing the first capacitor electrode 10 is flat and there is no slope angle. Therefore, the gate insulating layer with good density may be formed at the edge of the storage capacitor Cst. In this way, a part of the gate insulating layer corresponding to the storage capacitor Cst has good compactness and strong antistatic ability, which greatly reduces the probability of static electricity breaking down the gate insulating layer.

In some embodiments, the second capacitor electrode 20 includes a first side surface 201 facing the first gate line GL, the electrode body 101 includes a first side surface 1011 facing the first gate line GL, and the first side surface 201 of the second capacitor electrode is closer to the first gate line GL than the first side surface 1011 of the electrode body. For example, a distance between an orthographic projection of the first side surface 201 of the second capacitor electrode on the base substrate 1 and an orthographic projection of the first side surface 1011 of the electrode body on the base substrate 1 in the column direction Y is greater than a predetermined distance.

The second capacitor electrode 20 includes a second side surface 202 facing the second gate line GL, the electrode body 101 includes a second side surface 1012 facing the second gate line GL, and the second side surface 202 of the second capacitor electrode is closer to the second gate line GL than the second side surface 1012 of the electrode body. For example, a distance between an orthographic projection of the second side surface 202 of the second capacitor electrode on the base substrate 1 and an orthographic projection of the second side surface 1012 of the electrode body on the base substrate 1 in the column direction Y is greater than a predetermined distance.

The second capacitor electrode 20 includes a third side surface 203 facing the second data line DL, the electrode body 102 includes a third side surface 1013 facing the second data line DL, and the third side surface 203 of the second capacitor electrode is closer to the second data line DL than the third side surface 1013 of the electrode body. For example, a distance between an orthographic projection of the third side surface 203 of the second capacitor electrode on the base substrate 1 and an orthographic projection of the third side surface 1013 of the electrode body on the base substrate 1 in the row direction X is greater than a predetermined distance.

The second capacitor electrode 20 includes a fourth side surface 204 facing the first data line DL, the electrode body 102 includes a fourth side surface 1014 facing the first data line DL, and the fourth side surface 204 of the second capacitor electrode is closer to the first data line DL than the fourth side surface 1014 of the electrode body. For example, a distance between an orthographic projection of the fourth side surface 204 of the second capacitor electrode on the base substrate 1 and an orthographic projection of the fourth side surface 1014 of the electrode body on the base substrate 1 in the row direction X is greater than a predetermined distance.

It should be noted that in a process of forming the first capacitor electrode and the second capacitor electrode using an exposure apparatus, there is an alignment error between the first capacitor electrode and the second capacitor electrode. The alignment error depends on, for example, an alignment accuracy of the exposure apparatus. Moreover, in the process of forming the first capacitor electrode and the second capacitor electrode using the exposure equipment, there may be a certain slope angle at the edge of the second capacitor electrode. That is, the edge of the second capacitor electrode is not a completely vertical side surface, but an inclined surface with a certain slope. For example, in some specific examples, the alignment error between the first capacitor electrode and the second capacitor electrode is within 2.5 microns, and a length of the slope angle area at the edge of the second capacitor electrode is within 0.5 micrometers. In this way, the above-mentioned "predetermined distance" may be set to 3 microns. In this case, considering processing apparatus and process factors, it may be ensured that the orthographic projection of the second capacitor electrode 20 on the base substrate covers the orthographic projection of the electrode body 101 of the first capacitor electrode 10 on the base substrate.

In some embodiments, the above-mentioned at least one via hole 62 is disposed adjacent to the tip structure 30. For example, an orthographic projection of the at least one via hole 62 on the base substrate 1 falls within the orthographic projection of the first protrusion 102 on the base substrate 1. In this way, the via hole 62 is disposed adjacent to the first tip sub-structure 31 of the tip structure 30.

In the embodiments of the present disclosure, static electricity may be discharged along a path of the pixel electrode—the via hole—the first protrusion—the tip structure, that is, static electricity is released in the rightward direction in FIG. 2. The via hole 62 is disposed adjacent to the tip structure 30, which may shorten a length of the path of the static electricity discharging, which is thereby more conducive to static electricity discharging through the path.

For example, the display substrate may include more than two via holes 62. By disposing more than two via holes 62, a contact area between the pixel electrode and the first capacitor electrode may be increased, thereby a contact resistance between the pixel electrode and the first capacitor electrode is reduced.

For example, the more than two via holes 62 are disposed at an interval in the column direction Y. As shown in FIG. 2, the orthographic projection of the first protrusion 102 on the base substrate 1 is a rectangle, and a size of the rectangle in the column direction Y is greater than a size of the rectangle in the row direction X. In this case, the plurality of via holes 62 are disposed at an interval in the Y direction, which is beneficial to have enough space to dispose the plurality of via holes 62.

Some exemplary embodiments of the present disclosure also provide a display device. Referring to FIG. 7, the display device may include the above-mentioned display substrate. The display device may also include the electronic ink layer 9, the electronic ink layer 9 may be disposed on the side of the pixel conductive layer 7 away from the base substrate 1. For example, the electronic ink layer 9 may be disposed on the counter substrate 11. For example, the electronic ink layer 9 and the counter substrate 11 may adopt a paper film structure known in the art, which will not be repeated here.

It should be understood that the display device according to some exemplary embodiments of the present disclosure has all features and advantages of the above-mentioned display substrate, and the features and the advantages may be referred to the above description of the display substrate, which will not be repeated here.

As used herein, the terms "substantially", "about", "approximately" and other similar terms are used as approximate terms rather than as terms of degree, and the terms are intended to explain an inherent deviation of measured or calculated values recognized by those skilled in the art. Taking into account factors such as process fluctuations, measurement problems and errors related to the measurement of specific quantities (i.e, limitations of the measurement system), the terms "about" or "approximately" used herein includes the stated value and means that the specific value determined by those skilled in the art is within an acceptable range of deviation. For example, "about" may refer to be within one or more standard deviations, or may be within ±10% or ±5% of the stated value.

Although some embodiments according to the general inventive concept of the present disclosure have been illustrated and described, those skilled in the art will understand that changes may be made to the embodiments without departing from the principle and spirit of the general inventive concept of the present disclosure. And the scope of the present disclosure is defined by the claims and their equivalents.

What is claimed is:

1. A display substrate, comprising:
   a base substrate;
   a plurality of gate lines and a plurality of data lines on the base substrate, wherein each gate line extends in a row direction, each data line extends in a column direction, and the plurality of gate lines and the plurality of data lines intersect to surround a plurality of pixels;
   at least one thin film transistor on the base substrate and located in each pixel, wherein each thin film transistor comprises a gate electrode, a first electrode and a second electrode, the first electrode is one of a source electrode and a drain electrode, and the second electrode is the other one of the source electrode and the drain electrode;
   a storage capacitor on the base substrate and located in each pixel, wherein the storage capacitor comprises a first capacitor electrode and a second capacitor electrode, the first capacitor electrode and the second capacitor electrode are disposed oppositely, the first capacitor electrode and the second electrode are located in the same layer, and the first capacitor electrode comprises at least an electrode body; and
   a tip structure, wherein the tip structure and the first capacitor electrode are located in the same layer, and the tip structure comprises a first tip sub-structure and a second tip sub-structure,
   wherein among the gate lines and the data lines that surround any one of the pixels, the data line electrically connected to the thin film transistor in the any one of the pixels is a first data line; and wherein in the any one of the pixels, the first tip substructure is connected to a side surface of the electrode body facing the first data line, the second tip substructure is connected to a side surface of the first data line facing the electrode body, an end portion of the first tip sub-structure facing the first data line is formed as a first tip, an end portion of the second tip sub-structure facing the electrode body is formed as a second tip, and the first tip and the second tip are disposed oppositely and at an interval in the row direction.

2. The display substrate of claim 1, wherein the first capacitor electrode further comprises a first protrusion, and the first protrusion is located between the electrode body and the first tip sub-structure; and the first protrusion protrudes toward the first data line of the pixel relative to the electrode body, and the first tip sub-structure is connected to an end portion of the first protrusion facing the first data line.

3. The display substrate of claim 1, wherein an orthographic projection of the electrode body of the first capacitor electrode on the base substrate falls within an orthographic projection of the second capacitor electrode on the base substrate.

4. The display substrate of claim 1, wherein:

the first tip sub-structure comprises a first side surface close to the thin film transistor and a second side surface away from the thin film transistor, and the first side surface of the first tip sub-structure and the second side surface of the first tip sub-structure converge toward the first data line and intersect at the first tip; and/or the second tip sub-structure comprises a first side surface close to the thin film transistor and a second side surface away from the thin film transistor, and the first side surface of the second tip sub-structure and the second side surface of the second tip sub-structure converge toward the electrode body and intersect at the second tip.

5. The display substrate of claim 1, wherein a distance between the first tip and the second tip in the row direction is between 1 to 10 microns.

6. The display substrate of claim 2, wherein:

the first tip sub-structure comprises a first tip body portion, the first tip body portion is located between the first tip and the first protrusion, the first tip body portion comprises a first side surface close to the thin film transistor and a second side surface away from the thin film transistor, and the first side surface of the first tip body portion is parallel to the second side surface of the first tip body portion; and/or the second tip sub-structure comprises a second tip body portion, the second tip body portion is located between the second tip and the first data line, the second tip body portion comprises a first side surface close to the thin film transistor and a second side surface away from the thin film transistor, and the first side surface of the second tip body portion is parallel to the second side surface of the second tip body portion.

7. The display substrate of claim 6, wherein:

a distance between the first side surface of the first tip body portion and the second side surface of the first tip body portion in the column direction is between 3 to 10 microns; and/or, a distance between the first side surface of the second tip body portion and the second side surface of the second tip body portion in the column direction is between 3 to 10 microns.

8. The display substrate according to claim 3, wherein among the gate lines and the data lines that surround the any one of the pixels, the gate line electrically connected to the thin film transistor in the any one of the pixels is a first gate line, another data line disposed at an interval from the first data line is a second data line, and another gate line disposed at an interval from the first gate line is a second gate line; and the second capacitor electrode comprises a first side surface facing the first gate line, the electrode body comprises a first side surface facing the first gate line, and the first side surface of the second capacitor electrode is closer to the first gate line than the first side surface of the electrode body; and/or the second capacitor electrode comprises a second side surface facing the second gate line, the electrode body comprises a second side surface facing the second gate line, and the second side surface of the second capacitor electrode is closer to the second gate line than the second side surface of the electrode body; and/or the second capacitor electrode comprises a third side surface facing the second data line, the electrode body comprises a third side surface facing the second data line, and the third side surface of the second capacitor electrode is closer to the second data line than the third side surface of the electrode body; and/or the second capacitor electrode comprises a fourth side surface facing the first data line, the electrode body comprises a fourth side surface facing the first data line, and the fourth side surface of the second capacitor electrode is closer to the first data line than the fourth side surface of the electrode body.

9. The display substrate of claim 8, wherein:

a distance between an orthographic projection of the first side surface of the second capacitor electrode on the base substrate and an orthographic projection of the first side surface of the electrode body on the base substrate in the column direction is greater than 3 microns; and/or a distance between an orthographic projection of the second side surface of the second capacitor electrode on the base substrate and an orthographic projection of the second side surface of the electrode body on the base substrate in the column direction is greater than 3 microns; and/or a distance between an orthographic projection of the third side surface of the second capacitor electrode on the base substrate and an orthographic projection of the third side surface of the electrode body on the base substrate in the row direction is greater than 3 microns; and/or a distance between an orthographic projection of the fourth side surface of the second capacitor electrode on the base substrate and an orthographic projection of the fourth side surface of the electrode body on the base substrate in the row direction is greater than 3 microns.

10. The display substrate of claim 2, wherein the display substrate further comprises a pixel electrode on the base substrate and located in each pixel, and wherein the pixel electrode is electrically connected to the first capacitor electrode through at least one via hole, and an orthographic projection of the at least one via hole on the base substrate falls within an orthographic projection of the first protrusion on the base substrate.

11. The display substrate of claim 1, wherein the display substrate comprises a plurality of tip structures, and the plurality of tip structures are disposed at an interval in the column direction; and in each tip structure, the first tip of the first tip substructure and the second tip of the second tip substructure are disposed oppositely and at an interval in the row direction.

12. The display substrate of claim 10, wherein the display substrate further comprises a passivation layer, and the passivation layer is located between a layer where the pixel electrode is located and a layer where the first capacitor electrode is located; and at least a part of the passivation layer is located in a gap between the first tip and the second tip.

13. The display substrate of claim 12, wherein the display substrate further comprises a gate insulating layer, the gate insulating layer is located between a layer where the second capacitor electrode is located and the layer where the first capacitor electrode is located; and a dielectric constant of the gate insulating layer is greater than a dielectric constant of the passivation layer.

14. The display substrate of claim 2, wherein the at least one thin film transistor comprises a first thin film transistor and a second thin film transistor;

the first capacitor electrode comprises a second protrusion, the second protrusion and the first protrusion are located on the same side of the electrode body, the second protrusion is electrically connected to a first electrode of the first thin film transistor, a second electrode of the first thin film transistor is electrically connected to a first electrode of the second thin film transistor, and a second electrode of the second thin film transistor is electrically connected to the first data line; and the display substrate further comprises a common electrode line, the common electrode line extends in the row direction, and the common electrode line is electrically connected to the second capacitor electrode.

15. The display substrate of claim 1, wherein the second capacitor electrode and the gate electrode are located in the same layer.

16. A display device, wherein the display device comprises the display substrate of claim 1.

17. The display substrate of claim 2, wherein an orthographic projection of the electrode body of the first capacitor electrode on the base substrate falls within an orthographic projection of the second capacitor electrode on the base substrate.

18. The display substrate of claim 2, wherein:

the first tip sub-structure comprises a first side surface close to the thin film transistor and a second side surface away from the thin film transistor, and the first side surface of the first tip sub-structure and the second side surface of the first tip sub-structure converge toward the first data line and intersect at the first tip; and/or the second tip sub-structure comprises a first side surface close to the thin film transistor and a second side surface away from the thin film transistor, and the first side surface of the second tip sub-structure and the second side surface of the second tip sub-structure converge toward the electrode body and intersect at the second tip.

19. The display substrate of claim 2, wherein the display substrate comprises a plurality of tip structures, and the plurality of tip structures are disposed at an interval in the column direction; and in each tip structure, the first tip of the first tip substructure and the second tip of the second tip substructure are disposed oppositely and at an interval in the row direction.

* * * * *